US012707641B2

(12) United States Patent
Hossain et al.

(10) Patent No.: US 12,707,641 B2
(45) Date of Patent: Aug. 11, 2026

(54) PAGE BUFFER FOR MEMORY DEVICES

(71) Applicant: Micron Technology, Inc., Boise, ID (US)

(72) Inventors: Md Zahid Hossain, Boise, ID (US); Martin Popp, Meridian, ID (US); Xiaosong Zhang, Boise, ID (US); Surendranath C. Eruvuru, Boise, ID (US); Suvra Sarkar, Singapore (SG); Tianqi Xu, JiaDing (CN)

(73) Assignee: Micron Technology, Inc., Boise, ID (US)

( * ) Notice: Subject to any disclaimer, the term of this patent is extended or adjusted under 35 U.S.C. 154(b) by 887 days.

(21) Appl. No.: 17/900,455

(22) Filed: Aug. 31, 2022

(65) Prior Publication Data

US 2024/0064988 A1 Feb. 22, 2024

(30) Foreign Application Priority Data

Aug. 18, 2022 (SG) .......................... 10202250764C

(51) Int. Cl.
*H10B 43/40* (2023.01)
*H10B 41/40* (2023.01)
*H10B 41/50* (2023.01)

(52) U.S. Cl.
CPC ............ *H10B 43/40* (2023.02); *H10B 41/40* (2023.02); *H10B 41/50* (2023.02)

(58) Field of Classification Search
CPC ........ H10B 43/40; H10B 43/50; H10B 41/40; H10B 41/50
See application file for complete search history.

(56) References Cited

U.S. PATENT DOCUMENTS

2004/0071030 A1* 4/2004 Goda .................... H10B 69/00 257/E21.679
2021/0074724 A1* 3/2021 Kim .................... H10D 30/693
2023/0005875 A1* 1/2023 Shi .................... G11C 16/0483
2023/0074317 A1* 3/2023 Kim .................... H10B 43/10

FOREIGN PATENT DOCUMENTS

CN 113921525 A * 1/2022 ............ H10B 41/20

OTHER PUBLICATIONS

CN 113921525 A, PE2E English translation (Year: 2022).*
Naso, Giovanni, "1Tb density 4 bits per cell 3D NAND flash in 110s technology", Micron TLP Nonvolatile Products Technical Seminar 2017, (2017), 7 pages.

* cited by examiner

*Primary Examiner* — William B Partridge
*Assistant Examiner* — Linda J. Fleck
(74) *Attorney, Agent, or Firm* — Schwegman Lundberg & Woessner, P.A.

(57) ABSTRACT

A variety of applications can include apparatus having a memory device structured with a circuit under array (CuA) architecture. A page buffer region in the CuA can be formed with a periphery region that is horizontally adjacent to the page buffer region. Contacts to gates for transistors in the page buffer region can be formed to land only on these gates, separating and electrically isolating the contacts and associated gates from each other in the page buffer region. Contacts to gates for transistors in the periphery region can be formed to land on conductive regions disposed on gates for transistors in the periphery region.

16 Claims, 13 Drawing Sheets

PAGE BUFFER FOR MEMORY DEVICES

PRIORITY APPLICATION

This application claims the benefit of priority to Singaporan Patent Application Serial Number 10202250764C, filed Aug. 18, 2022, which is incorporated herein by reference in its entirety.

FIELD OF THE DISCLOSURE

Embodiments of the disclosure relate generally to memory systems, and more specifically, to page buffers for memory devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), synchronous dynamic random-access memory (SDRAM), and static RAM (SRAM) among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

Memory arrays are being designed as 3D structures in memory devices to increase memory density. The 3D memory array extends in a horizontal plane along a substrate, which can be designated as a x-y plane, and in a vertical direction, taken as the z direction perpendicular to the x-y plane. Other design considerations can be implemented with the 3D memory arrays such as using a circuit under array (CuA) architecture to enhance reduction of die size or increase utilization of space in a die. CuA refers generally to circuitry located in a memory die under a memory array of the memory die. The CuA can include control logic and sensing circuitry for sensing the programmed data states of memory cells of the memory array. With the control logic and sensing circuitry fabricated below the memory array using semiconductor processing that can include CMOS (Complementary Metal Oxide Semiconductor) processing technology, CuA, in some circles, can be referred to as CMOS under array.

For a 3D NAND memory array, which can include vertical strings of memory cells, using floating gate transistors or charge trap transistors, and connections from bit lines positioned above the 3D NAND, vertical connections extending though the 3D NAND memory array or through memory breaks within the 3D NAND memory array can be used to couple to sensing circuitry and other control logic of the CuA for the memory array. A CuA architecture, which allows for circuits that operate with a 3D memory array to be structured in a space in the substrate below the 3D memory array, provides capabilities for higher densities of memory cells. These capabilities address a desire to limit increases in the area (horizontal plane) of the memory die. For continued increases in memory capacity, other design considerations should be implemented for enhancements to reduce circuit area or limit increases of circuit area in memory die.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
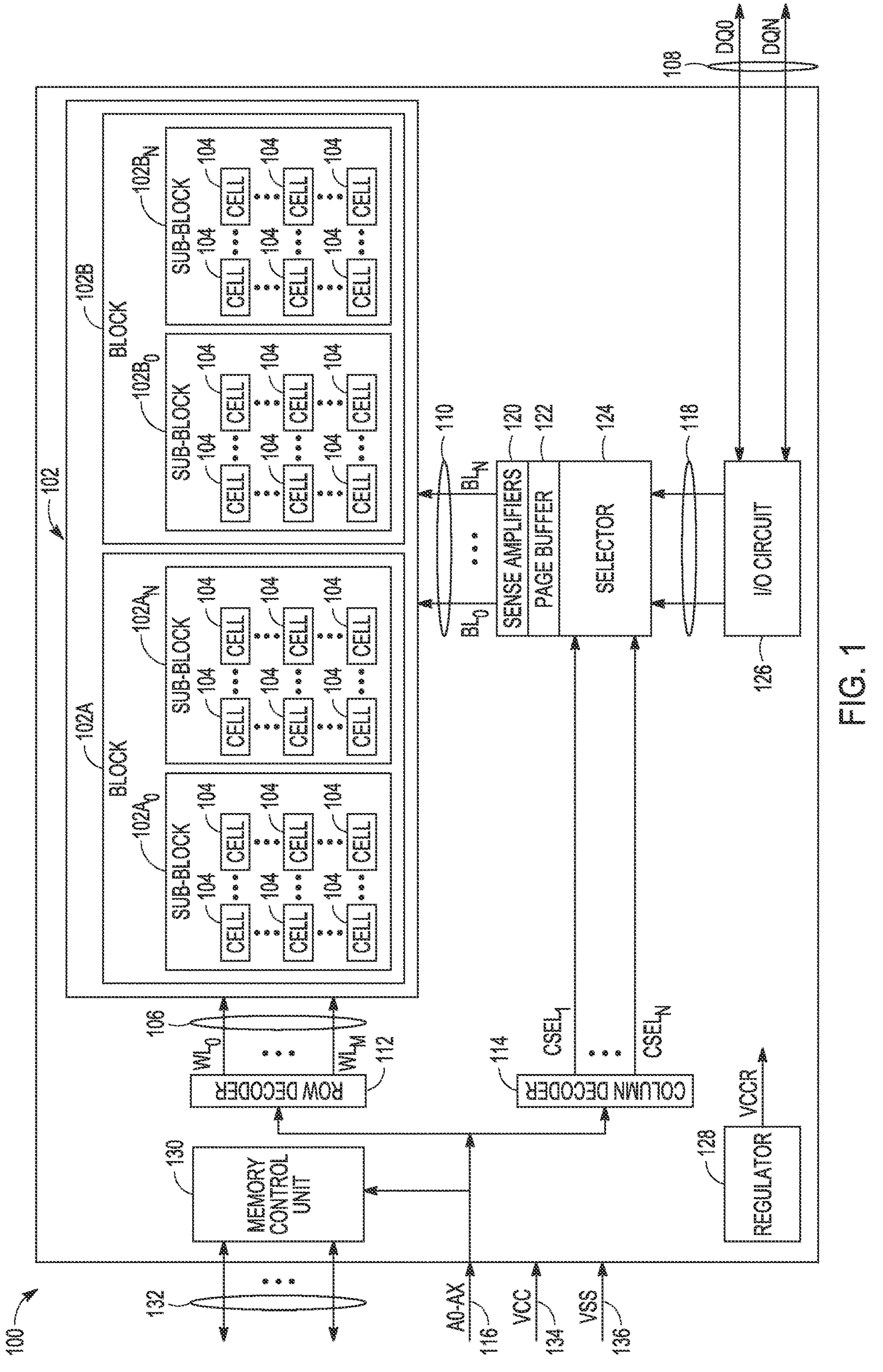
FIG. 1 illustrates a functional block diagram of an example memory device including a memory array and associated circuits, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Various memory device formats can be structured in a CuA architecture, such as but not limited to NOR or NAND architecture semiconductor memory arrays. Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series-coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states). The sensing and control circuitry for such NOR or NAND architecture semiconductor memory arrays can be structured beneath the respective memory array in a CuA architecture.

In a CuA architecture for a memory die having a 3D memory array, the CuA region can include circuits for controlling the operation of the 3D memory array. One or more control circuits of the CuA can provide control signals to the 3D memory array in order to perform a read operation or a write operation on the 3D memory array. The CuA can include one or more of control circuitry, state machines, decoders, sense amplifiers, read/write circuits, and controllers. These circuits can implement one or more memory array operations including erasing, programming, or reading operations. For example, the CuA region can include an on-chip memory controller for determining row and column address, word line and bit line addresses, memory array enable signals, and data latching signals. The operations on the 3D memory array are typically performed to access one or more memory cells in response to requests from other circuits on the memory die or a device external to the memory die. The CuA region can include pad structures to couple the memory array or one or more circuits in the CuA region to other portions of the die of the memory device, or to couple to devices external to the memory device.

In a NAND memory device, a page buffer (PB) is an interface circuit that connects the external world, for example input/output (I/O) data, to a data line for the memory array of the NAND memory device. The PB typically occupies a majority of the CuA space of the chip, for example approximately 50-60%. With NAND memory device designs moving to growing the NAND 3D memory array stack vertically to increase the bit density, with more functionality added to cater to independent-plane (i-plane) and independent-access line (iWL) read/write operation for parallelism, these added functionalities would use more CuA space. Scaling of the PB area is important for finding more CuA space for next generations of memory devices, in order to maintain a zero-periphery for the NAND memory die. Zero periphery architecture is the evolution of CuA architecture in which the entire periphery of circuitry for a memory array is moved under the memory array, providing significant savings in area usage. A prior PB architecture used a folded latch with staggered gates to reduce the PB area. However, that approach increases PB height in the digit line direction and consumes significant CuA space.

A test chip was designed with non-staggering gates to minimize the PB area and the gates of the transistors were separated from the nearby transistors using a polychop process. A polychop process is a technique in which conduction material gates of multiple transistors is formed in one direction, perpendicular to the active regions width direction of the transistors, and portions of the material are removed (chopped away) using photolithography, isolating the gates of the transistors from each other. The critical dimension (CD) for a polychop can be determined by the page buffer architecture and data line pitch. For example, for relatively high density array, a polychop process can be designed with a 193i lithography and negative tone development (NTD) process with a target CD of 50 nm. The process, i-line lithography, is photolithography using wavelength of i nm wavelength for exposure. For example, 365i lithography uses a 365 nm wavelength DUV radiation for exposure, while 193i lithography uses a 193 nm wavelength UV radiation for exposure. The 193i lithography process is much more complex than the 365i lithography process. With a polychop CD being aggressively scaled for page buffers, tighter specifications for registration budget makes the polychop process even more challenging.

In various embodiments, a process flow can be implemented without the use of 193i photo process and without an associated challenging etch of a conductive layer that is conventionally blanket deposited in gate formation. Such a process flow can avoid use of stringent CD control and etch depth control. Features of such process flow allows replacement of the expensive 193i photo process by a less involved process such as 365 i-line level and eliminates the complexity of a high aspect ratio etch associated with a blanket conductive layer, such as $WSi_x$ used in forming platforms for gate contacts, which typically has significantly tight registration and CD control procedures.

Embodiments of a process flow for isolating gates for PB scaling in the gate-access line direction. A less complex photolithographic process, such as but not limited to 365 i-line photolithography, can be used to selectively open a page buffer region followed by a dry etch to remove the blanket deposited conductive material, such as but not limited to $WSi_x$, from the page buffer latches. The dry etch can be a selective to underlying doped polysilicon. With the conductive material removed from contacting the polysilicon gate, a contact to the polysilicon gate can be landed on the gate polysilicon only for the PB devices in the PB region. In addition to the process simplification, improved cycle time and cost reduction can be achieved with an embodiment of a process flow as taught herein.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

FIG. 1 illustrates a functional block diagram of an embodiment of an example memory device 100 including a memory array 102 and associated circuits. Example memory device 100 includes a plurality of memory cells 104, and one or more circuits or components to provide communication with, or perform one or more memory operations on, the memory array 102. The memory device 100 can include a row decoder 112, a column decoder 114, sense amplifiers 120, a page buffer 122, a selector 124, an I/O circuit 126, and a memory control unit 130. In various embodiments, the memory device 100 can be structured with a CuA architecture. Control circuitry for the memory array 102 can be located in a CuA region below the memory array 102 in the CuA architecture.

The memory cells 104 of the memory array 102 can be arranged in blocks, such as first and second blocks 102A, 102B. Each block can include sub-blocks. For example, the first block 102A can include first and second sub-blocks 102$A_0$, 102$A_n$, and the second block 102B can include first and second sub-blocks 102$B_0$, 102$B_n$. Each sub-block can include a number of physical pages, with each page including a number of memory cells 104. Although illustrated herein as having two blocks, with each block having two sub-blocks, and each sub-block having a number of memory cells 104, in other examples, the memory array 102 can include more or fewer blocks, sub-blocks, memory cells, etc. In other examples, the memory cells 104 can be arranged in a number of rows, columns, pages, sub-blocks, blocks, etc., and accessed using, for example, access lines 106, first data lines 110, or one or more select gates, source lines, etc.

The memory control unit 130 can control memory operations of the memory device 100 according to one or more signals or instructions received on control lines 132, including, for example, one or more clock signals or control signals that indicate a desired operation (e.g., write, read, erase, etc.), or address signals (A0-AX) received on one or more address lines 116. One or more devices external to the memory device 100 can control the values of the control signals on the control lines 132 or the address signals on the address lines 116. Examples of devices external to the memory device 100 can include, but are not limited to, a host, a memory controller, a processor, or one or more circuits or components not illustrated in FIG. 1.

The memory device 100 can use access lines 106 and first data lines 110 to transfer data to (e.g., write or erase) or from (e.g., read) one or more of the memory cells 104. The row decoder 112 and the column decoder 114 can receive and decode the address signals (A0-AX) from the address lines 116, can determine which of the memory cells 104 are to be accessed, and can provide signals to one or more of the access lines 106 (e.g., one or more of a plurality of word lines (WL0-WLm)) or the first data lines 110 (e.g., one or more of a plurality of bit lines (BL0-BLn)), such as described above.

The memory device 100 can include sense circuitry, such as the sense amplifiers 120, configured to determine the values of data on (e.g., read), or to determine the values of data to be written to, the memory cells 104 using the first data lines 110. For example, in a selected string of memory cells 104, one or more of the sense amplifiers 120 can read a logic level in the selected memory cell 104 in response to a read current flowing in the memory array 102 through the selected string to the first data lines 110.

One or more devices external to the memory device 100 can communicate with the memory device 100 using the I/O lines (DQ0-DQN) 108, address lines 116 (A0-AX), or control lines 132. The I/O circuit 126 can transfer values of data in or out of the memory device 100, such as in or out of the page buffer 122 or the memory array 102, using the I/O lines 108, according to, for example, the control lines 132 and address lines 116. The page buffer 122 can store data received from the one or more devices external to the memory device 100 before the data is programmed into relevant portions of the memory array 102, or can store data read from the memory array 102 before the data is transmitted to the one or more devices external to the memory device 100.

The column decoder 114 can receive and decode address signals (A0-AX) into one or more column select signals (CSEL1-CSELn). The selector 124 (e.g., a select circuit) can receive the column select signals (CSEL1-CSELn) and select data in the page buffer 122 representing values of data to be read from or to be programmed into memory cells 104. Selected data can be transferred between the page buffer 122 and the I/O circuit 126 using second data lines 118. The memory control unit 130 can receive positive and negative supply signals, such as a supply voltage (VCCx) 134 and a negative supply (VSS) 136 (e.g., a ground potential), from an external source or supply (e.g., an internal or external battery, an AC-to-DC converter, etc.). In certain examples, the memory control unit 130 can include a regulator 128 to internally provide positive or negative supply signals.

Figure 2:
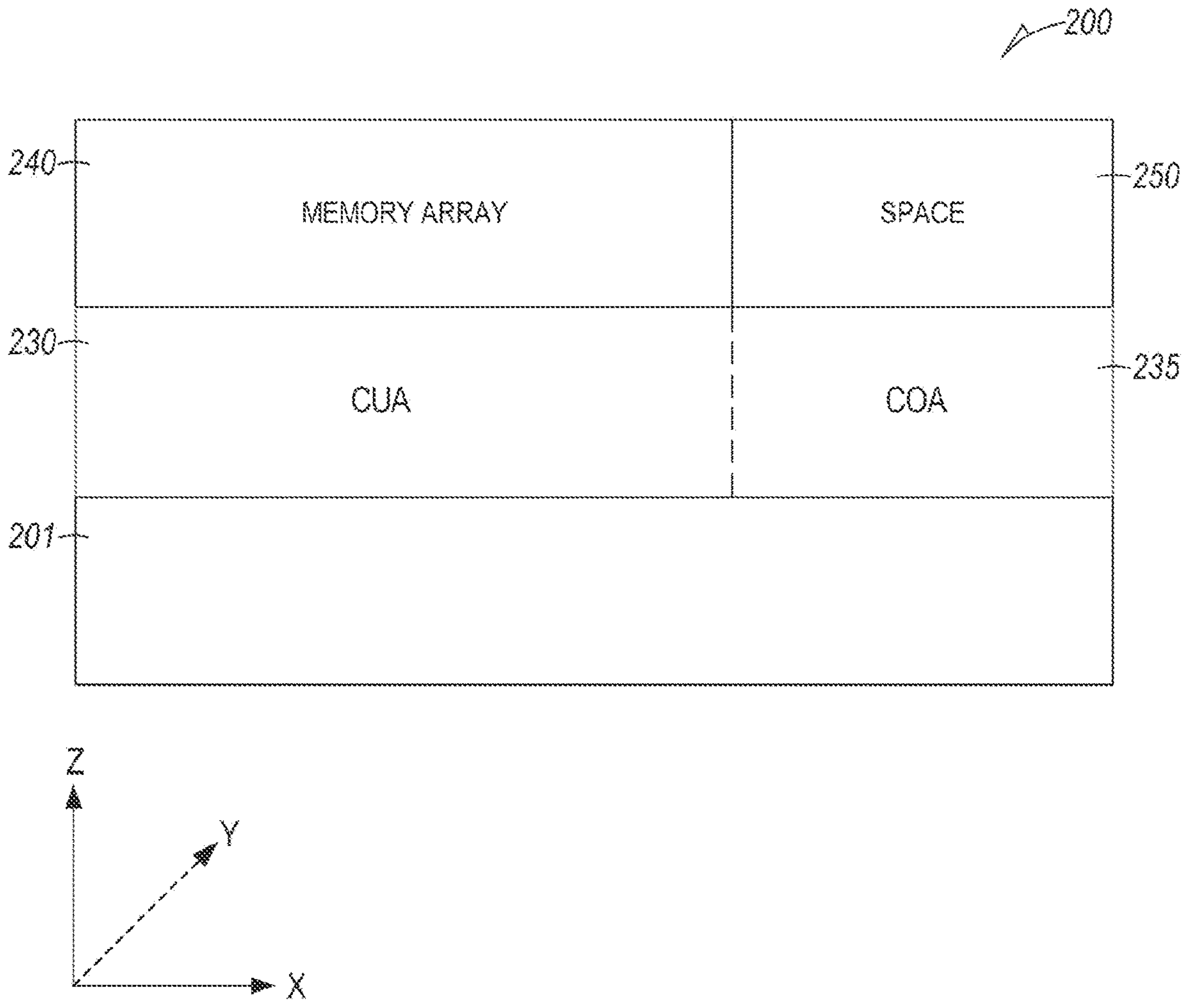
FIG. 2 is a block diagram of regions of an example memory device having a three-dimensional memory array in a circuit under array architecture, according to various embodiments.

FIG. 2 is a block diagram of regions of an embodiment of an example memory device 200 having a 3D memory array, in which the regions are shown in the z-x plane. A memory array region 240 having horizontal planes (x-y) of memory cells is disposed vertically over a CuA region 230 disposed in a substrate 201. The horizontal planes (x-y) of memory cells can be structured as multiple arranged tiers comprising memory cells. The CuA region 230 includes control circuitry for the memory array of the memory array region 240. The control circuitry in the CuA region 230 can include one or more instrumentalities similar to row decoder 112, column decoder 114, sense amplifiers 120, page buffer 122, selector 124, I/O circuit 126, and memory control unit 130 of memory device 100 shown in FIG. 1. A space 250 can be implemented adjacent the memory array region 240 and above the CuA region 230. The space 250 can be implemented beyond the horizontal extent of the memory array and may not directly contain elements of the control and sensing circuitry for the memory array, which can be located in the CuA region 230. The CuA region 230 can include a space of the CuA located directly below the 3D memory array of memory array region 240 such that this space of the CuA extends at least in one direction in the x-y plane to the same extent as the 3D memory array extends in this direction. The CuA region 230 can include a region in the die outside of the horizontal extent of the 3D memory array, referred to as OA, and below a level of the 3D memory array. In various embodiments, circuits or contacts can be structured outside the horizontal extent of and below a level of the 3D memory array. The circuits in this OA region can be referred to as circuits outside array, CoA, in a CoA region 235. The space of the CoA can be disposed adjacent the portion of the space of the CuA region 230 that contains control circuitry for the memory array of the memory array region 240 and below the level of the 3D memory array.

With the memory device 200 having a CoA region 235 adjacent the CuA region 230 containing control circuitry for the memory array and placed below a level of the memory array in memory array region 240, the space 250 can be arranged directly over the CoA region 235. The CoA region 235 can include pads to couple to nodes for external connections or pins of the package for the memory device 200. The space 250 can also be implemented with conductive columns to couple to the top levels of the memory device 200.

Figure 3:
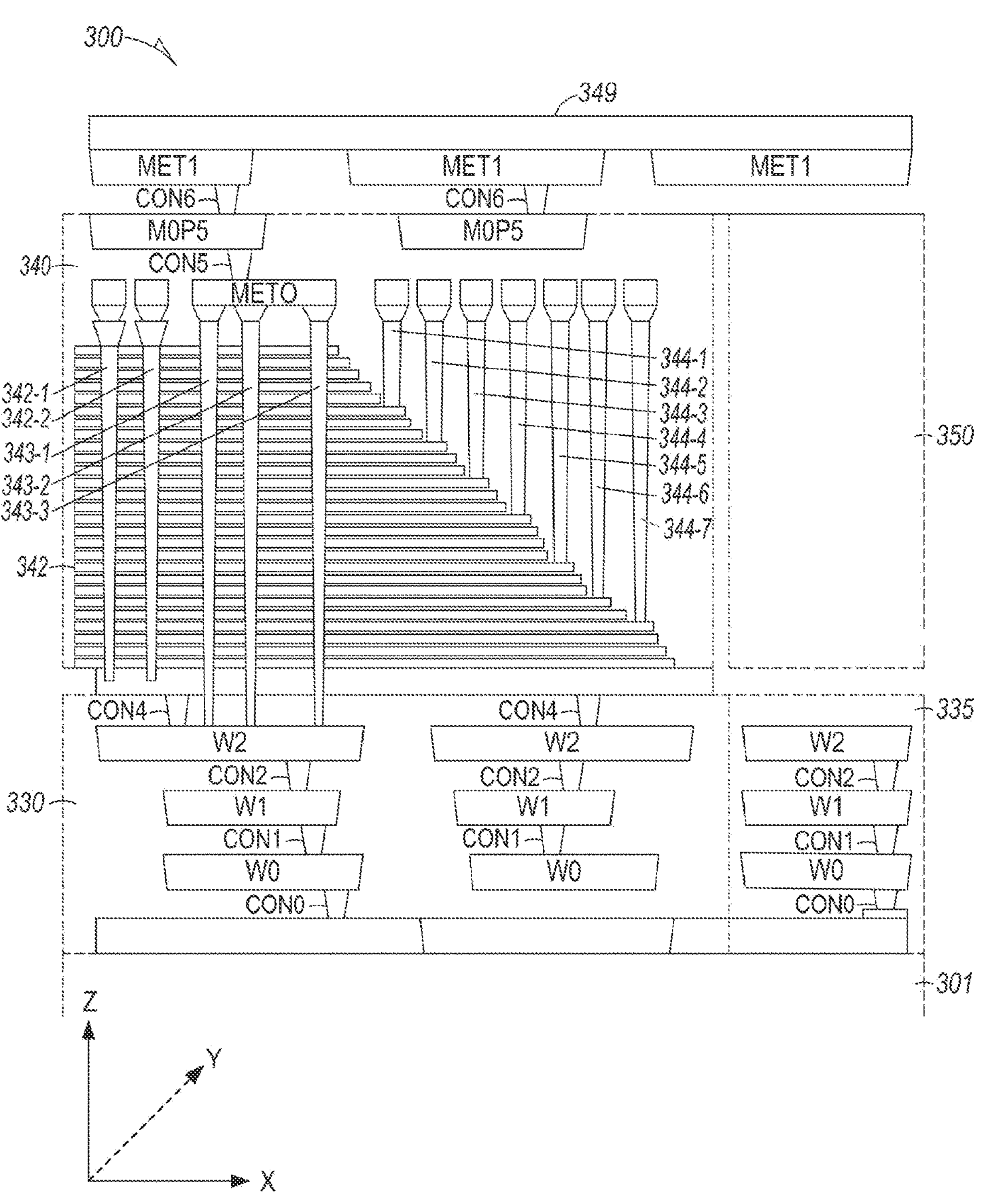
FIG. 3 is a representation of an example three-dimensional NAND memory device having a three-dimensional memory array with a circuit under array architecture, according to various embodiments.

FIG. 3 is a representation of an embodiment of an example 3D NAND memory device 300 having a 3D memory array, in which the regions are shown in a vertical cross-section in the z-x plane. A memory array region 340 having horizontal planes (x-y) of memory cells is disposed vertically over a CuA region 330 disposed in a substrate 301. The horizontal planes (x-y) of memory cells are structured as multiple arranged tiers 342 comprising memory cells. The CuA region 330 includes control circuitry for the memory array of the memory array region 340. The control circuitry can include one or more instrumentalities similar to row decoder 112, column decoder 114, sense amplifiers 120, page buffer 122, selector 124, I/O circuit 126, and memory control unit 130 of memory device 100 of FIG. 1 or other circuits to control access to selected memory cells of the tiers 342. A space 350, similar to the space 350 of FIG. 3, can be adjacent the memory array region 340 and above the CuA region 330. The 3D NAND memory device 300 can have a CoA region 335, as part of the CuA region 330, adjacent the section of the CuA region 330, where CuA region 330 contains the control circuitry and sensing of the memory array in memory array region 340, and below a level of the memory array in memory array region 340. The space 350 can be arranged directly over the CoA region 335. The CoA region 335 can include pads to couple to nodes for external connections or pins of the package for the memory device 300. The space 350 can also be implemented with conductive columns to couple to the top levels of the memory device 300.

FIG. 3 also illustrates some of the elements of a NAND memory device having a 3D memory array. For discussion purposes, a small number of structural elements are shown in FIG. 3. Memory cells of the tiers 342 can extend from pillars such as pillars 342-1 and 342-2. Though only two such pillars are shown, other such pillars are located with respect to the tiers 342. The 3D NAND memory device 300 can also include, but is not limited in number to, conductive contact vias 343-1, 343-2, and 343-3 along with conductive plugs 344-1 . . . 344-7. The pillars 342-1 and 342-2, the conductive contact vias 343-1, 343-2, and 343-3, and the conductive plugs 344-1 . . . 344-7 can extend above and below tiers 342 and can contact different metallization levels, which can be at various vertical locations in the structure of the 3D memory array of the memory array region 340, such that access to the memory cells in the tiers 342 can be attained by a device external to the 3D memory array. The pillars 342-1 and 342-2, the conductive contact vias 343-1, 343-2, and 343-3, and the conductive plugs 344-1 . . . 344-7, and other similar structures provide vertical connections extending through the 3D memory array or through memory breaks within the 3D memory array, which vertical connections can be used to couple to sensing circuitry and other control logic of the CuA region 330 for the 3D memory array.

As a non-limiting example, FIG. 3 shows two metal layers labelled W2, two metal layers labelled W1, and two metal layers labelled W0 in the CuA region 330, where these metal layers provide electrical connections with circuit elements in the CuA region 330. In some embodiments, metal layers may be replaced with conductively doped semiconductor material, such as but not limited to conductively doped polysilicon. Electrical connections between metal layers or conductive semiconductor layers at different vertical levels in the CuA region 330 can be provided by conductive contact vias labelled CON0, CON1, CON2, and CON4. Similarly, the CoA region 335 can include metal layers labelled W2, W1, and W0 to provide electrical connections with circuit elements in the CoA region 335.

At the top of the memory region 340 are metal layers labelled MOP5, which metal layers can interface with another metallization layer labelled MET1. MET1 can be top metallizations for the die containing the 3D NAND memory device 300 and can be covered by a passivation layer 349. The passivation layer 349 is an electrically insulating layer and can include one or more materials such as, but not limited to, tetraethyl orthosilicate (TEOS) and an oxynitride. The oxynitride, for example, can include silicon oxynitride. The various MOP5 layers can couple to various MET1 layers by different contact vias CON6 and can couple to the conductive contact vias 343-1, 343-2, and 343-3 in the memory array region 340.

The conductive contact vias 343-1, 343-2, and 343-3, which are conductive vias in the memory array region 340, can be long conductive vias, relative to the conductive contact vias CON0, CON1, CON2, CON4, CON5, and CON6. The conductive contact vias 343-1, 343-2, and 343-3 can couple to metal layers W2 in the CuA region 330. Other such relatively long structures such as the conductive contact vias 343-1, 343-2, and 343-3, which can be referred to as CON3 metal, can also terminate in a different metal layer MET0.

Figure 4:
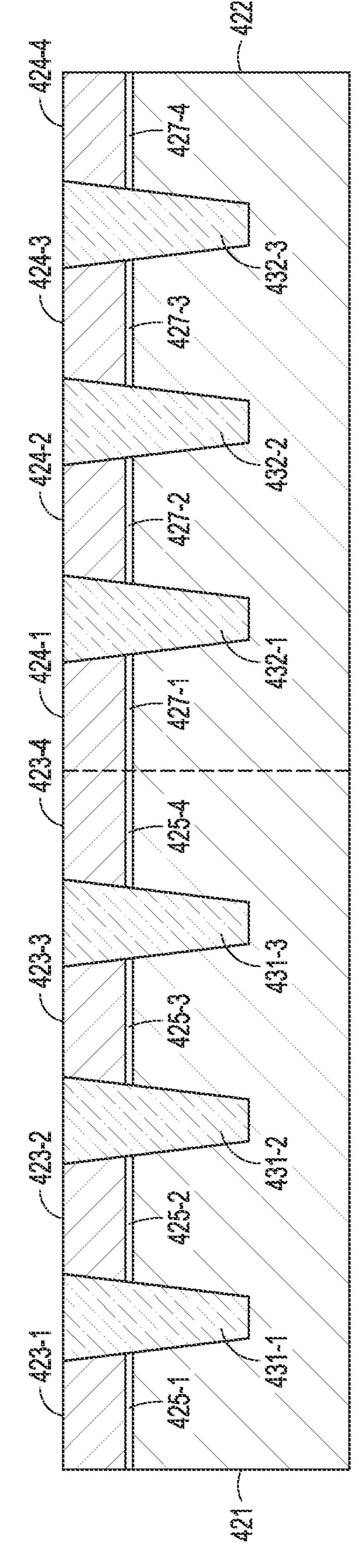
FIGS. 4-11 illustrate features of an example method of isolating gates and forming contacts to the gates in a page buffer region of a memory device, according to various embodiments.

FIGS. 4-11 illustrate features of an embodiment of an example method of isolating gates and forming contacts to the gates in a PB region of a memory device. The method can be implemented in forming PB circuits in a CuA architectures such as CuA region 230 of FIG. 2 and CuA region 330 of FIG. 3. FIG. 4 shows a cross-sectional view of structure 400 that can be a starting structure in which contacts can be made to gates of transistors, where structure 400 has a periphery region 421 located horizontally adjacent to a PB region 422 for the memory device. Periphery region 421 and PB region 422 can be processed simultaneously for the memory device. Periphery region has multiple gate regions 423-1, 423-2, 423-3, and 423-4 with gate regions 423-1 and 423-2 separated from each other by isolation region 431-1, gate regions 423-2 and 423-3 separated from each other by isolation region 431-2, and gate regions 423-3 and 423-4 separated from each other by isolation region 431-3. A gate dielectric 425-1 is disposed below and contacting gate region 423-1. A gate dielectric 425-2 is disposed below and contacting gate region 423-2. A gate dielectric 425-3 is disposed below and contacting gate region 423-3. A gate dielectric 425-4 is disposed below and contacting gate region 423-4. Though four gate regions with associated gate dielectrics and three isolation regions are shown in periphery region 421 of FIG. 4, periphery region 421 can include more than four gate regions with associated gate dielectrics separated from each other by more than three isolation regions.

PB region 422 has multiple gate regions 424-1, 424-2, 424-3, and 424-4 with gate regions 424-1 and 424-2 separated from each other by isolation region 432-1, gate regions 424-2 and 424-3 separated from each other by isolation region 432-2, and gate regions 424-3 and 424-4 separated from each other by isolation region 432-3. Though gate region 424-1 is shown connected to gate region 423-4, gate region can be separate from gate region 423-4. A gate dielectric 427-1 is disposed below and contacting gate region 424-1. A gate dielectric 427-2 is disposed below and contacting gate region 424-2. A gate dielectric 427-3 is disposed below and contacting gate region 424-3. A gate dielectric 427-4 is disposed below and contacting gate region 424-4. Though four gate regions with associated gate dielectrics and three isolation regions are shown in PB region 422 of FIG. 4, PB region 422 can include more than four gate regions with associated gate dielectrics separated from each other by more than three isolation regions. PB region 422 can include a number of gate regions corresponding to memory cells in a memory array of the memory device, where the memory device can include thousands or more of such components.

Multiple gate regions 423-1, 423-2, 423-3, and 423-4 and multiple gate regions 424-1, 424-2, 424-3, and 424-4 can be, but are not limited to, polysilicon gate regions. Isolation regions 431-1, 431-2, 431-3, 432-1, 432-2, and 431-3 can be, but are not limited to, shallow trench isolations (STIs). Gate dielectrics 425-1, 425-2, 425-3, 425-4, 427-1, 427-2, 427-3, and 427-4 can be an oxide dielectric, such as but not limited to, silicon oxide or a high-k oxide. Other high-k dielectrics can be used as gate dielectrics.

Figure 5:
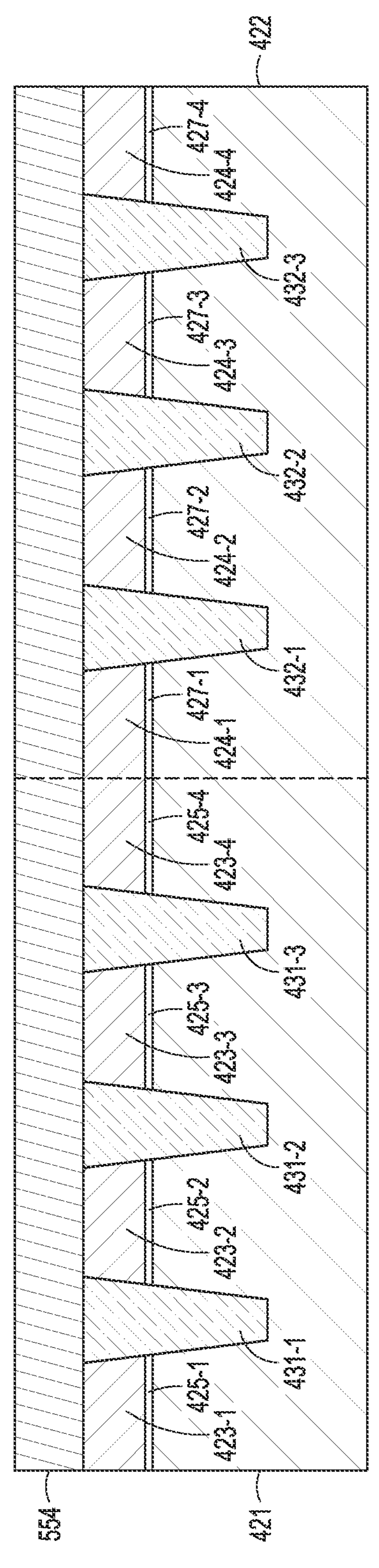

FIG. 5 shows a cross-sectional view of a structure 500 after a conductive region 554 has been continuously disposed on and contacting the structure 400 of FIG. 4. Conductive region 554 can be formed using an appropriate fabrication process such as an appropriate deposition process. Conductive region 554 contacts multiple gate regions 423-1, 423-2, 423-3, and 423-4 and isolation regions 431-1, 431-2, and 431-3 in periphery region 421. Conductive region 554 also contacts multiple gate regions 424-1, 424-2, 424-3, and 424-4 and isolation regions 434-1, 434-2, and 434-3 in PB region 422. Conductive region 554 can be a metallic region. Conductive region 554 can be $WSi_x$ or other conductive material. Conductive region 554 can be structured to have a thickness within a range of thicknesses, where the range can be dependent on the architecture of the memory device. A non-limiting example thickness of conductive region 554 can include 900 Å.

Figure 6:
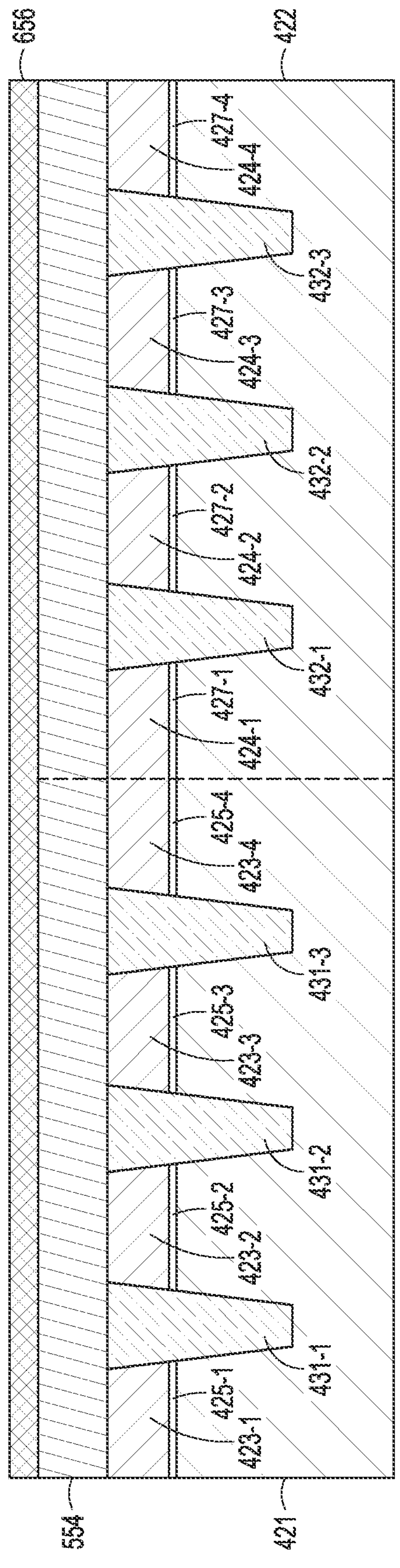

FIG. 6 shows a cross-sectional view of a structure 600 after a capping dielectric 656 has been disposed on and contacting conductive region 554 of structure 500 of FIG. 5. Capping dielectric 656 can be formed using an appropriate fabrication process such as an appropriate deposition process. Capping dielectric 656 can be a capping oxide dielectric, such as but not limited to a silicon oxide. Dielectrics other than oxides can be used in capping dielectric 656. Capping dielectric 656 can be structured to have a thickness within a range of thicknesses, where the range can be dependent on the architecture of the memory device. A non-limiting example thickness of capping dielectric 656 can include a thickness of 100 Å.

Figure 7:
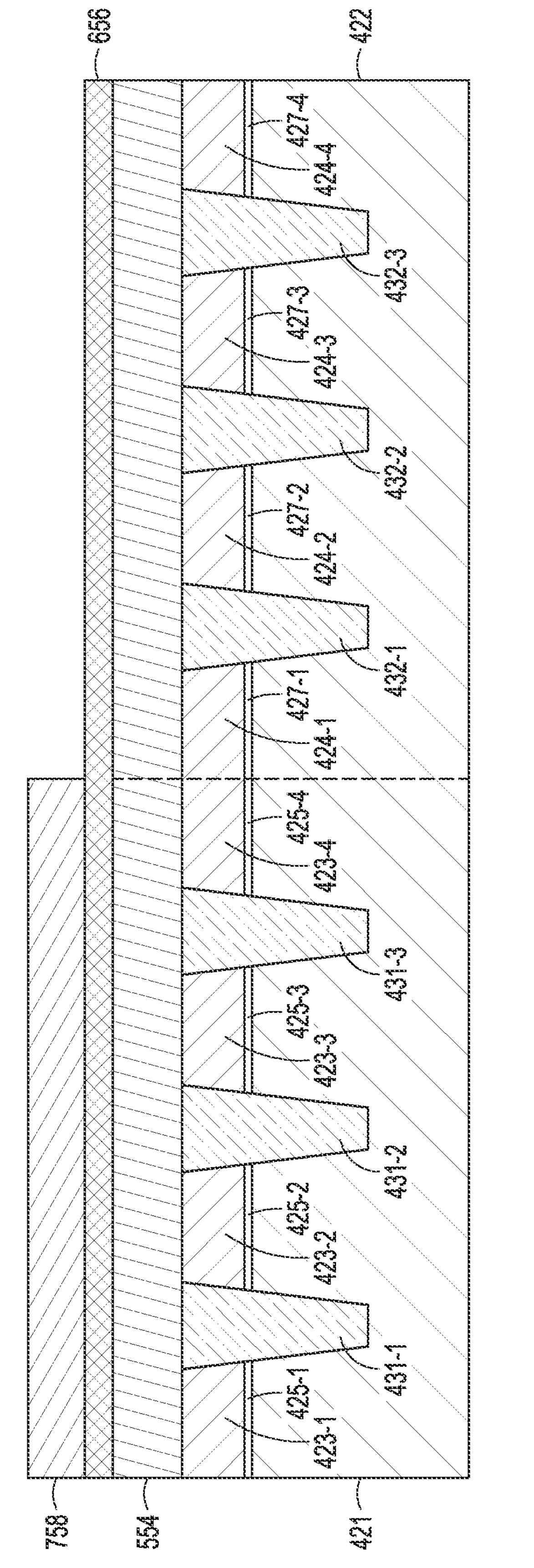

FIG. 7 shows a cross-sectional view of a structure 700 after a photolithographic process has been applied to structure 600 of FIG. 6. A 365-i line photo step can be used to open PB region 422 for further processing. Other i-line photolithographic processes can also be used. A masking region 758 can be used to protect capping dielectric 656 in periphery region 421, while allowing access to capping dielectric 656 on conductive region 554 in PB region 422.

Figure 8:
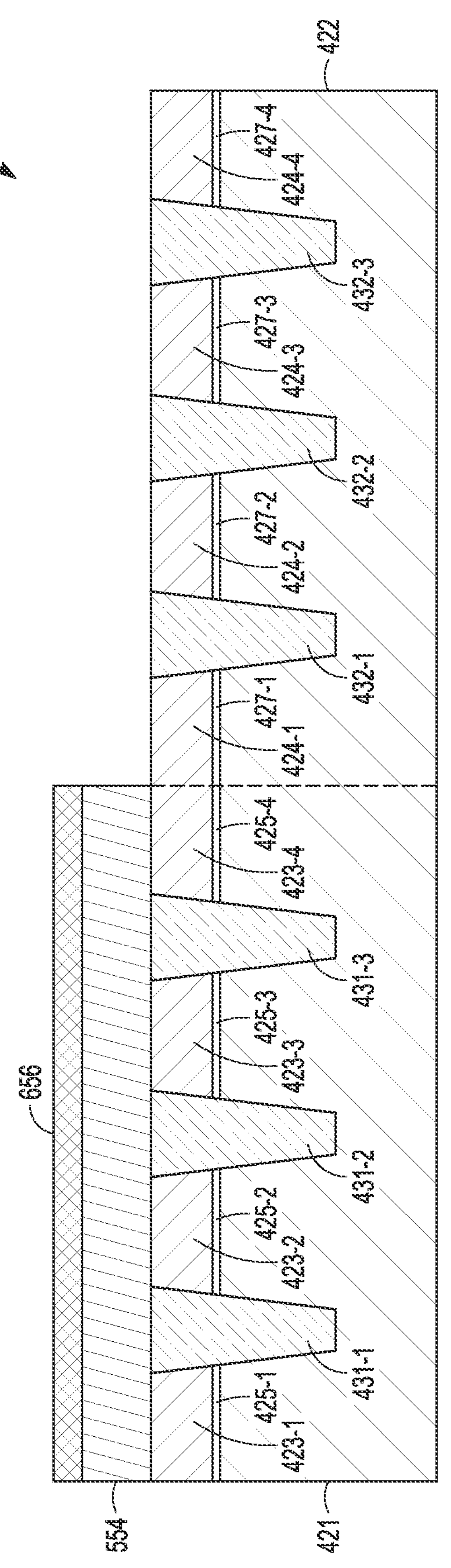

FIG. 8 shows a cross-sectional view of a structure 800 after removing capping dielectric 656 and conductive region 554 in PB region 422 of structure 700 of FIG. 7. Capping dielectric 656 and conductive region 554 can be removed using an appropriate removal process such as an appropriate etching process. Masking region 758 has also been removed.

Figure 9:
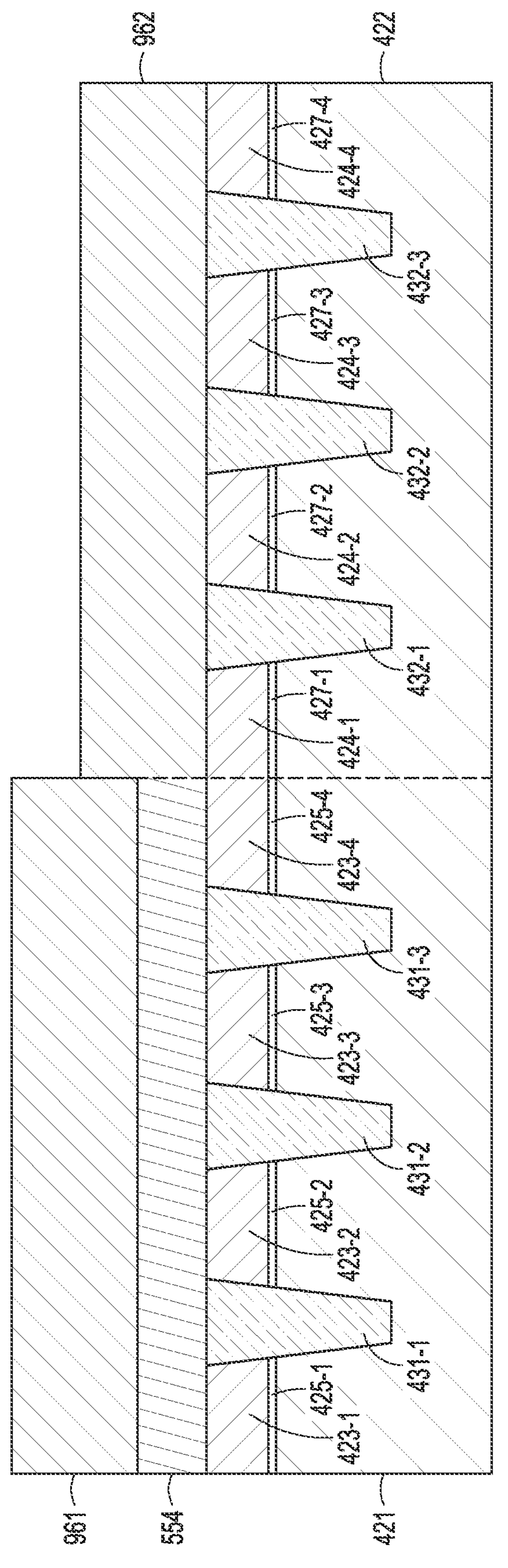

FIG. 9 shows a cross-sectional view of a structure 900 after an insulation dielectric 961 and an insulation dielectric 962 have been formed on the structure 800 of FIG. 8. Insulation dielectric 961 and insulation dielectric 962 can be formed using an appropriate fabrication process such as an appropriate deposition process. The insulation dielectrics 961 and 962 can be an oxide, such as but not limited to, TEOS. Other oxide or insulating dielectrics can be used. Insulation dielectrics 961 and 962 can be structured to have thicknesses within a range of thicknesses, where the range can be dependent on the architecture of the memory device. In various embodiments, insulation dielectric 961 on and contacting conductive region 554 in periphery region 421 can have the same thickness as insulation dielectric 962 on and contacting multiple gate regions 424-1, 424-2, 424-3, and 424-4 and isolation regions 434-1, 434-2, and 434-3 in PB region 422. A non-limiting example thickness of insulation dielectric 961 and insulation dielectric 962 can include 4000 Å.

Figure 10:
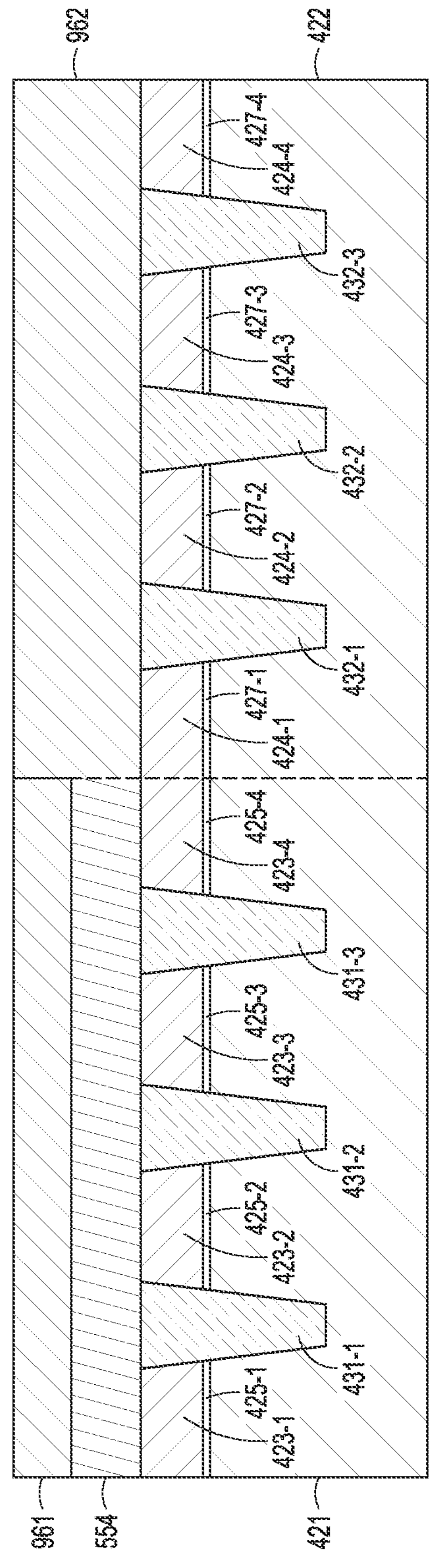

FIG. 10 shows a cross-sectional view of a structure 1000 after a chemical mechanical planarization (CMP) process has been applied to periphery region 421 and PB region 422 on the structure 900 of FIG. 9. CMP of insulation dielectric 961 and insulation dielectric 962 can be formed to set the thickness of insulation dielectric 961 over conductive region 554 in periphery region 421. Insulation dielectric 961 over conductive region 554 in periphery region 421 can be structured to have thicknesses within a range of thicknesses, where the range can be dependent on the architecture of the memory device. A non-limiting example thickness of insulation dielectric 961 over conductive region 554 in periphery region 421 can include 1500 Å over conductive region 554. This CMP can be a stop-in-film (SIF) CMP that can be followed by a gate etch to open the source/drain regions. The same gate etch can be used to isolate the periphery transistors from others in the gate width direction where they are not very dense. Further processing can be conducted in formation of transistors corresponding to the gate regions in periphery region 421 and PB region 422.

Figure 11:
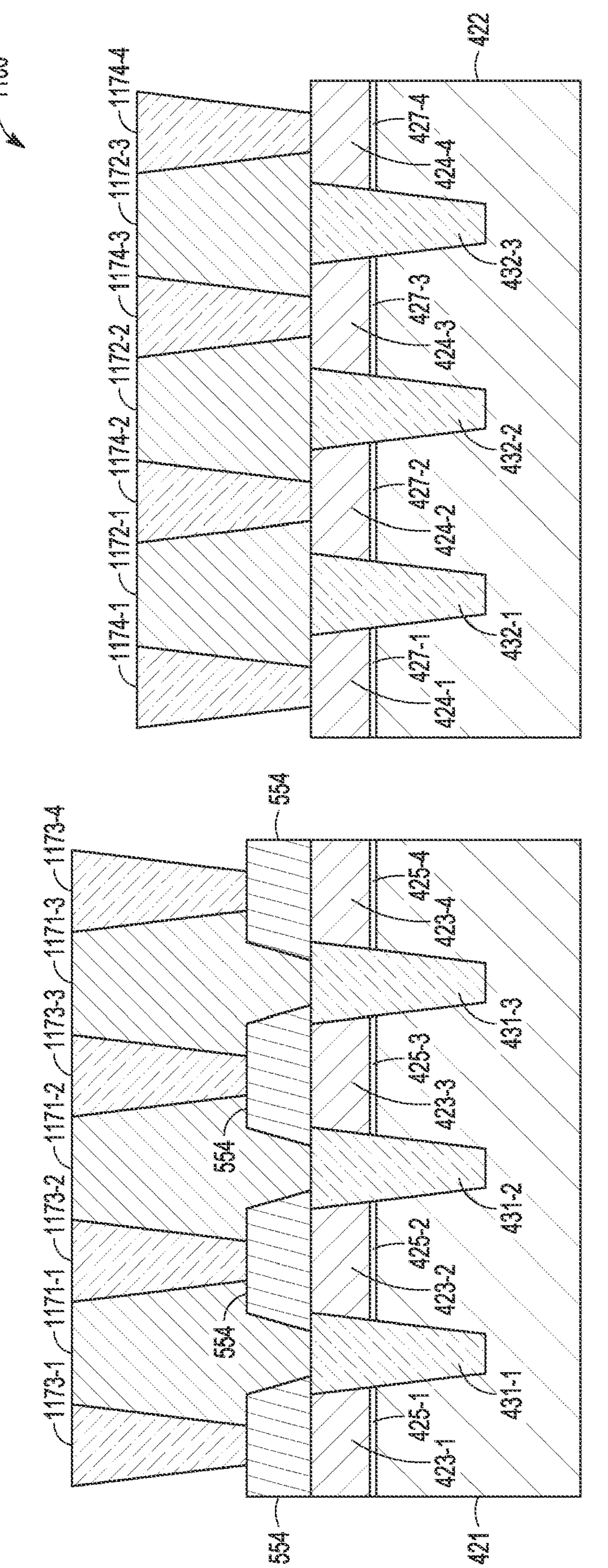

FIG. 11 shows a cross-sectional view of a structure 1100 after further processing of the structure 1000 of FIG. 10. Contacts 1173-1, 1173-2, 1173-3 and 1173-4 have been formed to land on conductive regions 554 that are on gate regions 425-1, 425-2, 425-3, and 425-4 with dielectrics 1171-1, 1171-2, and 1171-3 electrically isolates contacts 1173-1, 1173-2, and 1173-3 from each other. Contacts 1174-1, 1174-2, 1174-3 and 1174-4 have also been formed to land only on gate regions 424-1, 424-2, 424-3, and 424-4. Dielectrics 1172-1, 1172-2, and 1172-3 electrically isolates the contacts 1174-1, 1174-2, and 1174-3 from each other in the page buffer.

Figure 12:
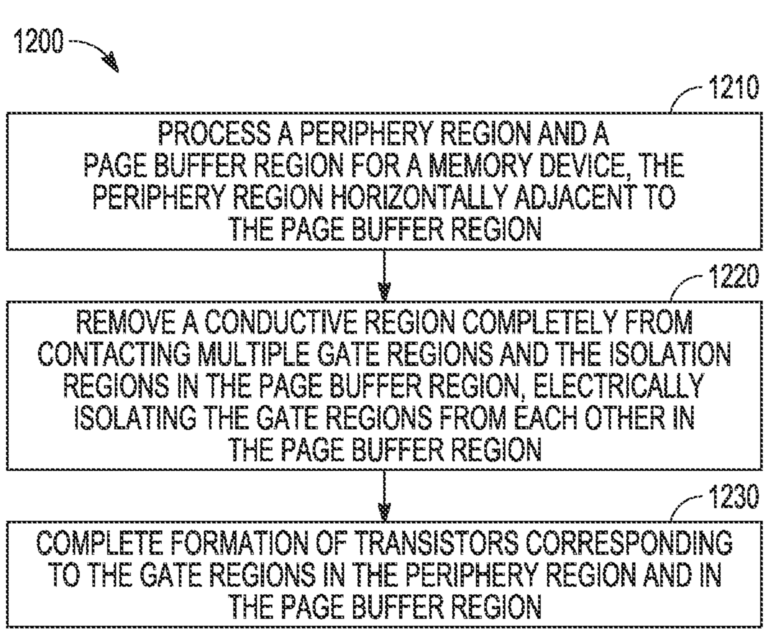
FIG. 12 is a flow diagram of features of an example method of forming a memory device, according to various embodiments.

FIG. 12 is a flow diagram of features of an embodiment of an example method 1200 of forming a memory device. At 1210, a periphery region and a page buffer region for the memory device is processed, where the periphery region is horizontally adjacent to the page buffer region. The periphery region and the page buffer region for the memory device can be processed simultaneously. Each of the periphery region and the page buffer region has multiple gate regions separated by isolation regions. A conductive region is continuously disposed on and contacts the multiple gate regions and the isolation regions in the periphery region and the page buffer region. The periphery region and the page buffer region can be disposed in a region for circuits below a memory array of the memory device.

At 1220, the conductive region is completely removed from contacting the multiple gate regions and the isolation regions in the page buffer region, electrically isolating the gate regions from each other in the page buffer region, and the conductive region in the periphery region is maintained. At 1230, after electrically isolating the gate regions from each other in the page buffer region, formation of transistors corresponding to the gate regions in the periphery region and in the page buffer region is completed to open up the transistor source-drain region. Note that the isolation for periphery gates is performed during the gate etch to open the source-drain.

Variations of the method 1200 or methods similar to the method 1200 can include a number of different embodiments that may be combined depending on the application of such methods, the architecture of the memory devices being formed, and/or the architecture of the memory system in which such memory devices are implemented. Such variations can include the conductive region having a tungsten silicide or tungsten. The multiple gate regions of the periphery region and the page buffer region can include polysilicon.

Variations of the method 1200 or methods similar to the method 1200 can include removing the conductive region by a process that includes dry etching the conductive region from the page buffer region. Such variations can include forming metal contacts directly to the gate regions in the page buffer region after electrically isolating the gate regions from each other in the page buffer region.

Figure 13:
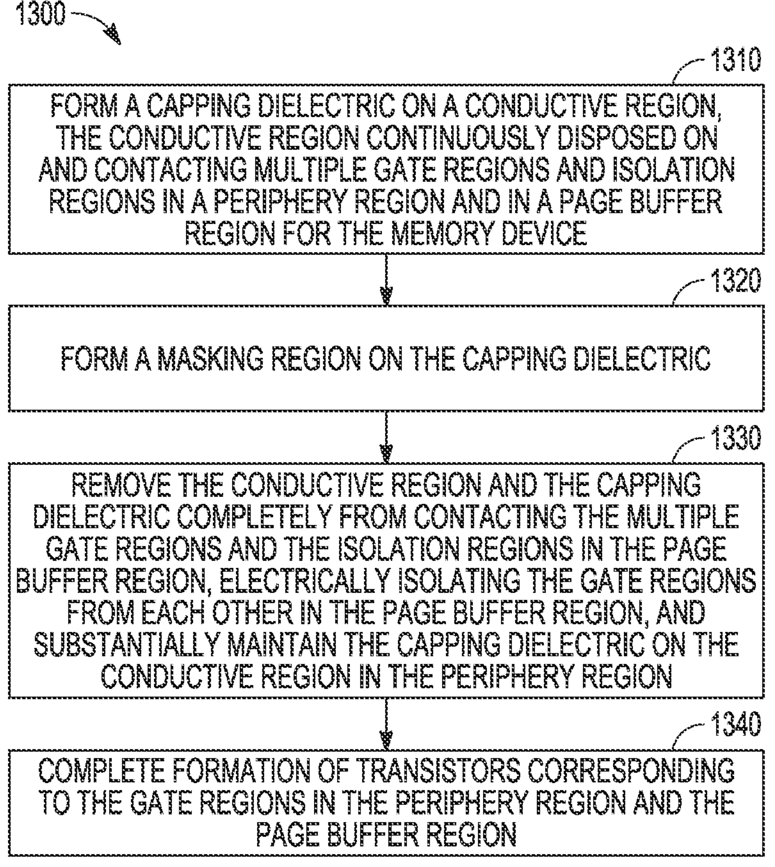
FIG. 13 is a flow diagram of features of an example method of forming a memory device, according to various embodiments.

FIG. 13 is a flow diagram of features of an embodiment of an example method 1300 of forming a memory device. At 1310, a capping dielectric is formed on a conductive region, where the conductive region is continuously disposed on and contacting multiple gate regions and isolation regions in a periphery region and in a page buffer region for the memory device. The multiple gate regions are separated from each other by the isolation regions. Forming the capping dielectric can include depositing an oxide. Prior to forming the capping dielectric, the multiple gate regions and the isolation regions in the periphery region and in the page buffer region can be formed and the conductive region can be blanket deposited on the periphery region and on the page buffer region. The periphery region and the page buffer region can be disposed in a region for circuits below a memory array of the memory device.

At 1320, a masking region is formed on the capping dielectric. Forming the masking region can be part of performing a photolithographic process. At 1330, the capping dielectric and the conductive region are completely removed from contacting the multiple gate regions and the isolation regions in the page buffer region, electrically isolating the gate regions from each other in the page buffer region, and the capping dielectric on the conductive region in the periphery region is substantially maintained. Removing the conductive region and capping dielectric can include etching material of the masking region above the capping dielectric on the conductive region in the periphery region and etching the capping dielectric and the conductive region from the page buffer region.

At 1340, after electrically isolating the gate regions from each other in the page buffer region, formation of transistors corresponding to the gate regions in the periphery region and the page buffer region is completed. Prior to completing formation of the transistors, an isolation dielectric can be formed on the electrically isolated gate regions in the page buffer region and on the maintained capping dielectric on the conductive region in the periphery region. The isolation dielectric can be subjected to a chemical-mechanical planarization such that a first top level of the isolation dielectric in the periphery region is at a top level of the isolation dielectric in the page buffer region. Forming the isolation dielectric can include forming tetraethyl orthosilicate (TEOS).

Variations of the method 1300 or methods similar to the method 1300 can include a number of different embodiments that may be combined depending on the application of such methods, the architecture of the memory devices being formed, and/or the architecture of the memory system in which such memory devices are implemented. Such variations can include a tungsten silicide or tungsten used in the conductive region. Variations can include forming metal contacts directly to the gate regions in the page buffer region and coupling the metal contacts to provide vertical electrical communication paths to one or more circuits for a memory array of the memory device.

In various embodiments, a memory device can comprise a memory array extending above a substrate, a page buffer region disposed in a region below the memory array, and a periphery region horizontally adjacent to the page buffer region. The page buffer region includes multiple transistors, where each transistor of the multiple transistors in the page buffer region has a gate region directly coupled to a metal contact to provide a vertical electrical communication path to one or more circuits associated with the memory array. The periphery region has multiple transistors, where each transistor of the multiple transistors in the periphery region has a gate region coupled to a metal contact by a conductive region.

Variations of such a memory device or similar memory devices can include a number of different embodiments that may be combined depending on the application of such memory devices or the architecture of devices or systems in which such memory devices are implemented. Such variations can include each transistor of the multiple transistors in the page buffer region being separated from other transistors of the multiple transistors in the page buffer region by shallow trench isolations. Variations can include the gate regions of the multiple transistors in the page buffer region and the gate regions of the multiple transistors in the periphery region structured to include polysilicon. Variations can include the conductive region structured to include a tungsten silicide or tungsten.

Figure 14:
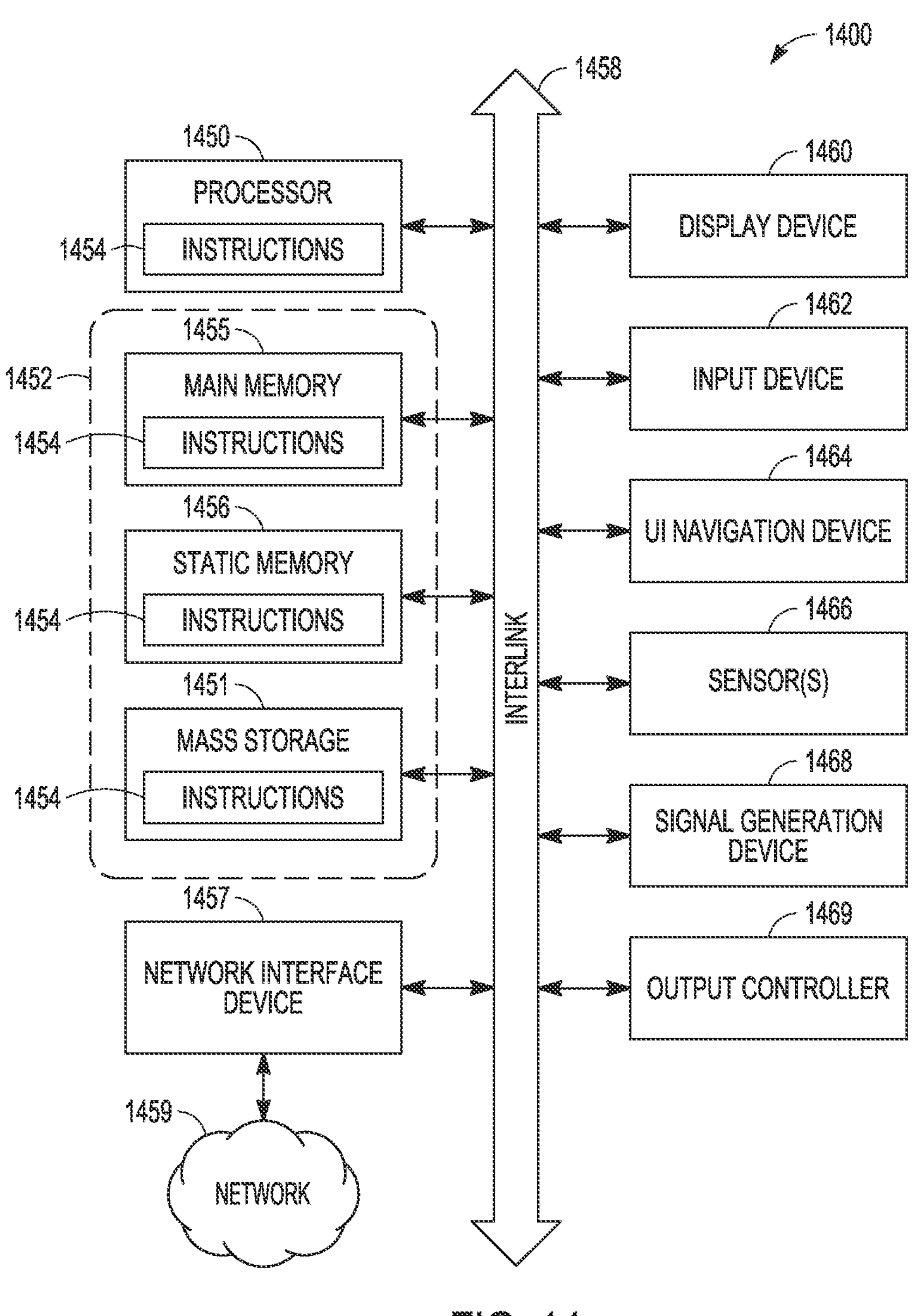
FIG. 14 is a block diagram illustrating an example of a machine upon which one or more embodiments may be implemented, according to various embodiments.

FIG. 14 illustrates a block diagram of an example machine 1400 having one or more memory devices having a CuA architecture. Such memories can include a memory array extending over a substrate, with the memory array including multiple vertically arranged tiers comprising memory cells. The CuA can include a page buffer region and a periphery region, with the periphery region being horizontally adjacent to the page buffer region. The page buffer region in the CUA can be formed simultaneously with the periphery region. Contacts to gates for transistors in the page buffer region can be formed to land only on these gates, separating and electrically isolating the contacts and associated gates from each other in the page buffer region. Contacts to gates for transistors in the periphery region can be formed to land on conductive regions disposed on gates for transistors in the periphery region. The machine 1400, having one or more such memory devices, may operate as a standalone machine or may be connected, for example networked, to other machines.

In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 1400 can be arranged to operate with one or more memory devices having a CuA architecture such as but not limited to the example memory device 200 of FIG. 2 or memory device 300 of FIG. 3. The example machine 1400 can include one or more memory devices functionally structured similar to memory device 100 of FIG. 1.

Examples, as described herein, may include, or may operate by logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1400 may include a hardware processor 1450 (e.g., a CPU, a GPU, a hardware processor core, or any combination thereof), a main memory 1455, and a static memory 1456, some or all of which may communicate with each other via an interlink 1458 (e.g., bus). The machine 1400 may further include a display device 1460, an input device 1462, which can be an alphanumeric input device (e.g., a keyboard), and a user interface (UI) navigation device 1464 (e.g., a mouse). In an example, the display device 1460, input device 1462, and UI navigation device 1464 may be a touch screen display. The machine 1400 may additionally include a mass storage device (e.g., drive unit) 1451, a network interface device 1457, a signal generation device 1468, and one or more sensors 1466, such as a global positioning system (GPS) sensor, compass, accelerometer, or other sensor. The machine 1400 may include an output controller 1469, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1400 may include a machine-readable medium 1452 on which is stored one or more sets of data structures or instructions 1454 (e.g., software) embodying or utilized by the machine 1400 to perform any one or more of the techniques or functions for which the machine 1400 is designed. The instructions 1454 may also reside, completely or at least partially, within the main memory 1455, within static memory 1456, or within the hardware processor 1450 during execution thereof by the machine 1400. In an example, one or any combination of the hardware processor 1450, the main memory 1455, the static memory 1456, or the mass storage device 1451 may constitute the machine-readable medium 1452.

While machine-readable medium 1452 is illustrated as a single medium, the term "machine-readable medium" may include a single medium or multiple media (e.g., a centralized or distributed database, or associated caches and servers) configured to store the one or more instructions 1454. The term "machine-readable medium" may include any medium that is capable of storing and encoding instructions for execution by the machine 1400 and that cause the machine 1400 to perform any one or more of the techniques to which the machine 1400 is designed, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 1454 (e.g., software, programs, an operating system (OS), etc.) or other data are stored on the mass storage device 1451, can be accessed by the main memory 1455 for use by the hardware processor 1450. The main memory 1455 (e.g., DRAM) is typically fast, but volatile, and thus a different type of storage than the mass storage device 1451 (e.g., an SSD), which is suitable for long-term storage, including while in an "off" condition. The instructions 1454 or data in use by a user or the machine 1400 are typically loaded in the main memory 1455 for use by the hardware processor 1450. When the main memory 1455 is full, virtual space from the mass storage device 1451 can be allocated to supplement the main memory 1455; however, because the mass storage device 1451 is typically slower than the main memory 1455, and write speeds are typically at least twice as slow as read speeds, use of virtual memory can greatly reduce user experience due to storage device latency (in contrast to the main memory 1455, e.g., DRAM). Further, use of the mass storage device 1451 for virtual memory can greatly reduce the usable lifespan of the mass storage device 1451.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1454 may further be transmitted or received over a network 1459 using a transmission medium via the signal generation device 1468 or the network interface device 1457 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the signal generation device 1468 or network interface device 1457 may include one or more physical jacks (e.g., Ethernet, coaxial, or phone jacks) or one or more antennas to connect to the network 1459. In an example, the signal generation device 1468 or the network interface device 1457 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 1400, and includes instrumentalities to propagate digital or analog communications signals to facilitate communication of such instructions, which instructions may be implemented by software.

The following are example embodiments of systems and methods, in accordance with the teachings herein.

An example method 1 of forming a memory device can comprise: processing a periphery region and a page buffer region for the memory device, the periphery region horizontally adjacent to the page buffer region, with each of the periphery region and the page buffer region having multiple gate regions separated by isolation regions and having a conductive region continuously disposed on and contacting the multiple gate regions and the isolation regions in the periphery region and the page buffer region; removing the conductive region completely from contacting the multiple gate regions and the isolation regions in the page buffer region, electrically isolating the gate regions from each other in the page buffer region; and completing, after electrically isolating the gate regions from each other in the page buffer region, formation of transistors corresponding to the gate regions in the periphery region and in the page buffer region.

An example method 2 of forming a memory device can include features of example method 1 of forming a memory device and can include the periphery region and the page buffer region being disposed in a region for circuits below a memory array of the memory device.

An example method 3 of forming a memory device can include features of any of the preceding example methods of forming a memory device and can include the conductive region to include a tungsten silicide or tungsten.

An example method 4 of forming a memory device can include features of any of the preceding example methods of forming a memory device and can include the multiple gate regions of the periphery region and the page buffer region including polysilicon.

An example method 5 of forming a memory device can include features of any of the preceding example methods of forming a memory device and can include removing the conductive region to include dry etching the conductive region from the page buffer region.

An example method 6 of forming a memory device can include features of any of the preceding example methods of forming a memory device and can include forming metal contacts directly to polysilicon gate regions in the page buffer region after electrically isolating the gate regions from each other in the page buffer region and make gate contacts in the periphery region using tungsten.

In an example method 7 of forming a memory device, any of the example methods 1 to 6 of forming a memory device may be performed in forming an electronic memory apparatus further comprising a host processor and a communication bus extending between the host processor and the memory device.

In an example method 8 of forming a memory device, any of the example methods 1 to 7 of forming a memory device may be modified to include operations set forth in any other of example methods 1 to 7 of forming a memory device.

In an example method 9 of forming a memory device, any of the example methods 1 to 8 of forming a memory device may be implemented at least in part through use of instructions stored as a physical state in one or more machine-readable storage devices.

An example method 10 of forming a memory device can include features of any of the preceding example methods 1 to 9 of forming a memory device and can include performing functions associated with any features of example memory devices and systems having memory devices discussed herein.

An example machine-readable storage device 1 storing instructions, that when executed by one or more processors, cause a machine to perform operations, can comprise instructions to perform functions associated with any features of example memory devices and systems having memory devices discussed herein or perform methods associated with any features of example methods 1 to 10.

An example method 11 of forming a memory device can comprise: forming a capping dielectric on a conductive region, the conductive region continuously disposed on and contacting multiple gate regions and isolation regions in a periphery region and in a page buffer region for the memory device, with the multiple gate regions separated from each other by the isolation regions, the periphery region horizontally adjacent to the page buffer region; forming a masking region on the capping dielectric; removing the conductive region and capping dielectric completely from contacting the multiple gate regions and the isolation regions in the page buffer region, electrically isolating the gate regions from each other in the page buffer region, and substantially maintaining the capping dielectric on the conductive region in the periphery region; and completing, after electrically isolating the gate regions from each other in the page buffer region, formation of transistors corresponding to the gate regions in the periphery region and the page buffer region.

An example method 12 of forming a memory device can include features of example method 11 of forming a memory device and can include, prior to forming the capping dielectric: forming the multiple gate regions and the isolation regions in the periphery region and in the page buffer region; and blanket depositing the conductive region on the periphery region and on the page buffer region.

An example method 13 of forming a memory device can include features of any of the example methods 11 or 12 of forming a memory device and can include, prior to completing formation of the transistors: forming an isolation dielectric on the electrically isolated gate regions in the page buffer region and on the maintained capping dielectric on the conductive region in the periphery region; and subjecting the isolation dielectric to a chemical-mechanical planarization such that a first top level of the isolation dielectric in the periphery region is at a top level of the isolation dielectric in the page buffer region.

An example method 14 of forming a memory device can include features of any of the example methods 11 to 13 of forming a memory device and can include forming the isolation dielectric to include forming tetraethyl orthosilicate (TEOS).

An example method 15 of forming a memory device can include features of any of the example methods 11 to 14 of forming a memory device and can include the periphery region and the page buffer region being disposed in a region for circuits below a memory array of the memory device.

An example method 16 of forming a memory device can include features of any of the example methods 11 to 15 of forming a memory device and can include the conductive region to include a tungsten silicide or tungsten.

An example method 17 of forming a memory device can include features of any of the example methods 11 to 16 of forming a memory device and can include forming the capping dielectric to include depositing an oxide.

An example method 18 of forming a memory device can include features of any of the example methods 11 to 17 of forming a memory device and can include forming the masking region as part of performing a photolithographic process.

An example method 19 of forming a memory device can include features of any of the example methods 11 to 18 of forming a memory device and can include removing the conductive region and capping dielectric to include etching material of the masking region above the capping dielectric on the conductive region in the periphery region and etching the capping dielectric and the conductive region from the page buffer region.

An example method 20 of forming a memory device can include features of any of the example methods 11 to 19 of forming a memory device and can include forming metal contacts directly to the gate regions in the page buffer region, and coupling the metal contacts to provide vertical electrical communication paths to one or more circuits for a memory array of the memory device.

In an example method 21 of forming a memory device, any of the example methods 11 to 20 of forming a memory device may be performed in forming an electronic memory apparatus further comprising a host processor and a communication bus extending between the host processor and the memory device.

In an example method 22 of forming a memory device, any of the example methods 11 to 21 of forming a memory device may be modified to include operations set forth in any other of example methods 1 to 19 of forming a memory device.

In an example method 23 of forming a memory device, any of the example methods 11 to 22 of forming a memory device may be implemented at least in part through use of instructions stored as a physical state in one or more machine-readable storage devices.

An example method 24 of forming a memory device can include features of any of the preceding example methods 11 to 23 of forming a memory device and can include performing functions associated with any features of example memory devices and systems having memory devices discussed herein.

An example machine-readable storage device 2 storing instructions, that when executed by one or more processors, cause a machine to perform operations, can comprise instructions to perform functions associated with any features of example memory devices and systems having memory devices discussed herein or perform methods associated with any features of example methods 11 to 24.

An example memory device 1 can comprise: a memory array extending above a substrate; a page buffer region disposed in a region below the memory array, the page buffer region including multiple transistors, each transistor of the multiple transistors in the page buffer region having a gate region directly coupled to a metal contact to provide a vertical electrical communication path to one or more circuits associated with the memory array; and a periphery region horizontally adjacent to the page buffer region, the periphery region having multiple transistors, each transistor of the multiple transistors in the periphery region having a gate region coupled to a metal contact by a conductive region.

An example memory device 2 can include features of example memory device 1 and can include each transistor of the multiple transistors in the page buffer region being separated from other transistors of the multiple transistors in the page buffer region by shallow trench isolations.

An example memory device 3 can include features of any of the preceding example memory devices and can include the gate regions of the multiple transistors in the page buffer region and the gate regions of the multiple transistors in the periphery region to include polysilicon.

An example memory device 4 can include features of any of the preceding example memory devices and can include the conductive region to include a tungsten silicide or tungsten.

In an example memory device 5, any of the memory devices of example memory devices 1 to 4 may include memory devices incorporated into an electronic memory apparatus further comprising a host processor and a communication bus extending between the host processor and the memory device.

In an example memory device 6, any of the memory devices of example memory devices 1 to 5 may be modified to include any structure presented in another of example memory device 1-5.

In an example memory device 7, any apparatus associated with the memory devices of example memory devices 1 to 6 may further include a machine-readable storage device configured to store instructions as a physical state, wherein the instructions may be used to perform one or more operations of the apparatus.

In an example memory device 8, any of the memory devices of example memory devices 1 to 7 may be formed in accordance with any of the methods of the following example methods 1 to 24.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method of forming a memory device, the method comprising:

processing a periphery region and a page buffer region for the memory device, the periphery region horizontally adjacent to the page buffer region, with each of the periphery region and the page buffer region having multiple gate regions separated by isolation regions and having a conductive region continuously disposed on and contacting the multiple gate regions and the isolation regions in the periphery region and the page buffer region;

removing the conductive region completely from contacting the multiple gate regions and the isolation regions in the page buffer region, electrically isolating the gate regions from each other in the page buffer region; and completing, after electrically isolating the gate regions from each other in the page buffer region, formation of transistors corresponding to the gate regions in the periphery region and in the page buffer region.

2. The method of claim 1, wherein the periphery region and the page buffer region are disposed in a region for circuits below a memory array of the memory device.

3. The method of claim 1, wherein the conductive region includes a tungsten silicide or tungsten.

4. The method of claim 1, wherein the multiple gate regions of the periphery region and the page buffer region include polysilicon.

5. The method of claim 1, wherein removing the conductive region includes dry etching the conductive region from the page buffer region.

6. The method of claim 1, wherein the method includes forming metal contacts directly to polysilicon gate regions in the page buffer region after electrically isolating the gate regions from each other in the page buffer region and make gate contacts in the periphery region using tungsten.

7. A method of forming a memory device, the method comprising:

forming a capping dielectric on a conductive region, the conductive region continuously disposed on and contacting multiple gate regions and isolation regions in a periphery region and in a page buffer region for the memory device, with the multiple gate regions separated from each other by the isolation regions, the periphery region horizontally adjacent to the page buffer region;

forming a masking region on the capping dielectric;

removing the capping dielectric and the conductive region completely from contacting the multiple gate regions and the isolation regions in the page buffer region, electrically isolating the gate regions from each other in the page buffer region, and maintaining the capping dielectric on the conductive region in the periphery region; and completing, after electrically isolating the gate regions from each other in the page buffer region, formation of transistors corresponding to the gate regions in the periphery region and the page buffer region.

8. The method of claim 7, wherein the method includes, prior to forming the capping dielectric:

forming the multiple gate regions and the isolation regions in the periphery region and in the page buffer region; and blanket depositing the conductive region on the periphery region and on the page buffer region.

9. The method of claim 7, wherein the method includes, prior to completing formation of the transistors:

forming an isolation dielectric on the electrically isolated gate regions in the page buffer region and on the maintained capping dielectric on the conductive region in the periphery region; and subjecting the isolation dielectric to a chemical-mechanical planarization such that a first top level of the isolation dielectric in the periphery region is at a top level of the isolation dielectric in the page buffer region.

10. The method of claim 9, wherein forming the isolation dielectric includes forming tetraethyl orthosilicate.

11. The method of claim 7, wherein the periphery region and the page buffer region are disposed in a region for circuits below a memory array of the memory device.

12. The method of claim 7, wherein the conductive region includes a tungsten silicide or tungsten.

13. The method of claim 7, wherein forming the capping dielectric includes depositing an oxide.

14. The method of claim 7, wherein forming the masking region is part of performing a photolithographic process.

15. The method of claim 7, wherein removing the conductive region and capping dielectric includes etching material of the masking region above the capping dielectric on the conductive region in the periphery region and etching the capping dielectric and the conductive region from the page buffer region.

16. The method of claim 7, wherein the method includes:

forming metal contacts directly to the gate regions in the page buffer region; and coupling the metal contacts to provide vertical electrical communication paths to one or more circuits for a memory array of the memory device.

* * * * *